(12) United States Patent
Chandler et al.

(10) Patent No.: US 9,940,995 B1
(45) Date of Patent: Apr. 10, 2018

(54) METHODS AND APPARATUS FOR REUSING LOOKUP TABLE RANDOM-ACCESS MEMORY (LUTRAM) ELEMENTS AS CONFIGURATION RANDOM-ACCESS MEMORY (CRAM) ELEMENTS

(71) Applicant: Intel Corporation, Santa Clara, CA (US)

(72) Inventors: Trevis Chandler, Dundas (CA); Jung Ko, Santa Clara, CA (US); Kenneth Duong, San Jose, CA (US); Dipak Sikdar, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/421,098

(22) Filed: Jan. 31, 2017

(51) Int. Cl.
*G11C 11/00* (2006.01)
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC .................................................. G11C 11/419

USPC ........................................................ 365/154
See application file for complete search history.

(56) References Cited

U.S. PATENT DOCUMENTS

| | | | |
|---|---|---|---|
| 5,352,940 A | 10/1994 | Watson | |
| 5,889,413 A | 3/1999 | Bauer | |
| 6,288,568 B1 | 9/2001 | Bauer et al. | |
| 6,373,279 B1 | 4/2002 | Bauer et al. | |
| 7,535,476 B2 | 5/2009 | Tang et al. | |
| 7,558,148 B2 * | 7/2009 | Sukegawa .......... | G11C 16/0483 365/185.02 |

\* cited by examiner

*Primary Examiner* — Huan Hoang
(74) *Attorney, Agent, or Firm* — Treyz Law Group, P.C.; Jason Tsai

(57) ABSTRACT

A programmable integrated circuit may include configuration random-access memory (CRAM) cells and lookup table random-access memory (LUTRAM) cells. The programmable integrated circuit may include a CRAM column and at least two LUTRAM columns, a first portion of which is operable as LUTRAM cells and a second portion of which is reused as CRAM cells. Each of the memory cells have a configuration write port and a read port. The configuration write ports of the first portion may be gated, whereas the configuration write ports of the second portion lack gating logic. The read port of the memory cells in the LUTRAM columns may be masked only when the first portion of cells are operated in RAM mode and are currently being accessed.

17 Claims, 9 Drawing Sheets

US 9,940,995 B1

METHODS AND APPARATUS FOR REUSING LOOKUP TABLE RANDOM-ACCESS MEMORY (LUTRAM) ELEMENTS AS CONFIGURATION RANDOM-ACCESS MEMORY (CRAM) ELEMENTS

BACKGROUND

This relates to integrated circuits and more particularly, to programmable integrated circuits.

Programmable integrated circuits are a type of integrated circuit that can be programmed by a user to implement a desired custom logic function. In a typical scenario, a logic designer uses computer-aided design (CAD) tools to design a custom logic circuit. When the design process is complete, the computer-aided design tools generate configuration data. The configuration data is loaded into memory elements to configure the devices to perform the functions of the custom logic circuit.

A programmable integrated circuit typically includes programmable logic circuitry organized into a plurality of logic blocks. Each logic block consists of smaller logic elements that are coupled to memory elements. In particular, a logic block includes two different types of memory elements: (1) a first type of random-access memory element that is only used to store configuration data and is therefore referred to as configuration random-access memory (CRAM) memory cells and (2) a second type of random-access memory element that is operable to store either configuration data or user data and is commonly referred to as lookup table random-access memory (LUTRAM) cells.

A conventional logic block includes two LUTRAM columns and two CRAM columns. As an example, the two LUTRAM columns may include 400 LUTRAM cells per column or a combined total of 800 LUTRAM cells, whereas the two CRAM columns may include 450 CRAM cells per column or a combined total to 900 CRAM cells. In certain scenarios, only 600 out of the 800 LUTRAM cells are being utilized while only 500 out of the 900 CRAM cells are being utilized. In other words, 200 LUTRAM cells and 400 CRAM cells are completely unused, which is expensive due to the wasted die area and leakage power consumed by the unused memory cells.

It is within this context that the embodiments described herein arise.

SUMMARY

An integrated circuit such as a programmable integrated circuit may include multiple memory columns. A first memory column may include lookup table random-access memory (LUTRAM) cells, whereas a second memory column may include configuration random-access memory (CRAM) cells. The LUTRAM cells may be operable in at least two different modes: a lookup table (LUT) mode and a random-access memory (RAM) mode. The CRAM cells may be operable in only the LUT mode. In accordance with an embodiment, a portion of the LUTRAM column may be reused as CRAM cells.

Each memory cell in the first column (i.e., the LUTRAM column) may have a user write port, a configuration write port, and a read port. The LUTRAM cells in the LUTRAM column have include gating logic at each of their configuration write ports to block the configuration write when those cells are placed in RAM mode. The portion of the LUTRAM column being reused as CRAM cells may lack any gating logic at their configuration write ports.

The read port of each memory cell in the LUTRAM column may also be coupled to a read masking circuit. The read masking circuit may be implemented using a pull-down transistor. The read masking circuit may be controlled by address decoding logic. The address decoding logic may be configured to activate the read masking circuit to mask a read operation only when the LUTRAM cells are operated in RAM mode and when one of the LUTRAM cells is currently being accessed.

Further features of the invention, its nature and various advantages will be more apparent from the accompanying drawings and following detailed description.

DETAILED DESCRIPTION

Embodiments of the present invention relate to integrated circuits and more particularly, to programmable integrated circuits with memory elements.

A programmable integrated circuit may include logic regions sometimes referred to as memory logic array blocks. These memory logic array blocks may include columns of lookup table random-access memory (LUTRAM) cells and configuration random-access memory (CRAM) cells. The CRAM cells may provide static configuration bits to implement user logic functions on the device. On the other hand, the LUTRAM cells may either operate as a CRAM cell in a lookup table (LUT) mode or as a static random-access memory (SRAM) cell in a user memory mode or RAM mode. When operated in the RAM mode, a LUTRAM cell is used to store user data and is therefore not used as a lookup table or a CRAM cell to configure other parts of the integrated circuit device.

In many applications, at least a portion the memory cells in the LUTRAM column may be unused. The nonutilized cells can therefore be reused as CRAM cells to provide configuration to other parts of the logic design on the integrated circuit. This may require special handling of the configuration write and readback operations to ensure that LUTRAM and CRAM cells can coexist in the same column. Configured in this way, the programmable integrated circuit can include fewer CRAM columns, thereby saving circuit area and leakage power.

It will be recognized by one skilled in the art, that the present exemplary embodiments may be practiced without some or all of these specific details. In other instances, well-known operations have not been described in detail in order not to unnecessarily obscure the present embodiments.

Figure 1:
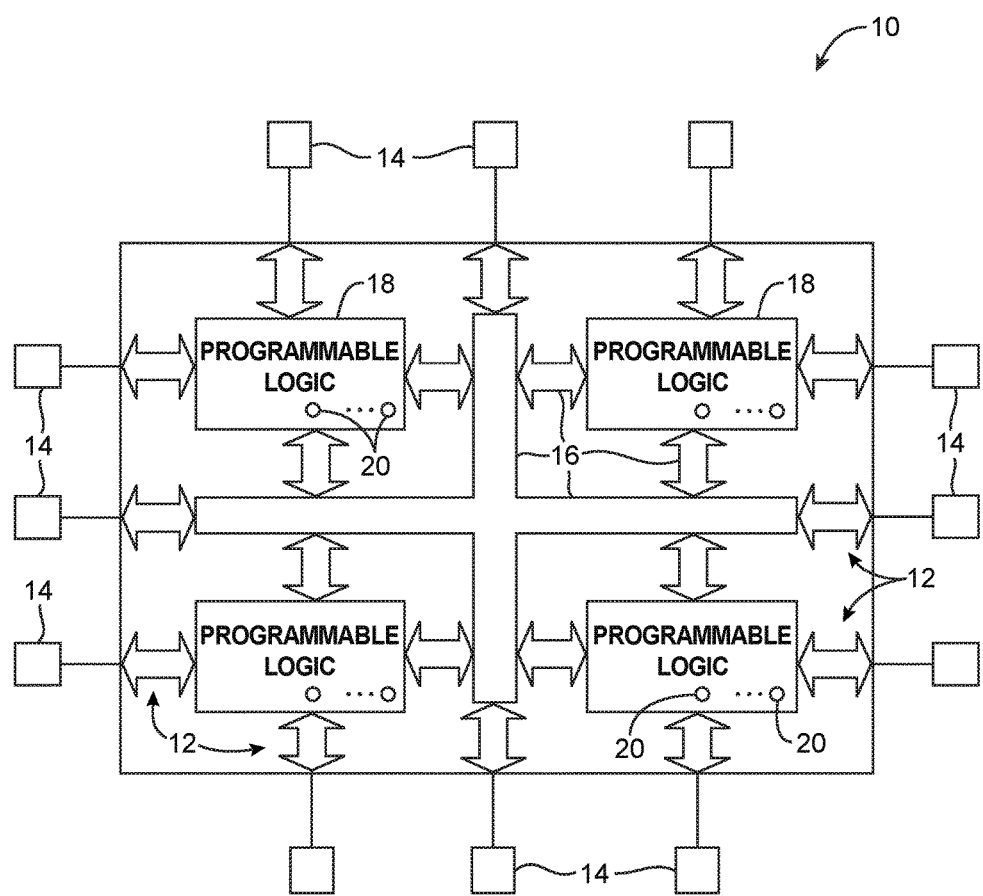
FIG. 1 is a diagram of an illustrative programmable integrated circuit in accordance with an embodiment.

FIG. 1 is a diagram of an illustrative programmable integrated circuit such as programmable logic device (PLD) 10. As shown in FIG. 1, device 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and input-output circuitry 12. Once loaded, the memory elements each provide a corresponding static control output signal that controls the state of an associated logic component in programmable logic 18. Typically, the memory element output signals are used to control the gates of metal-oxide-semi-conductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 2:
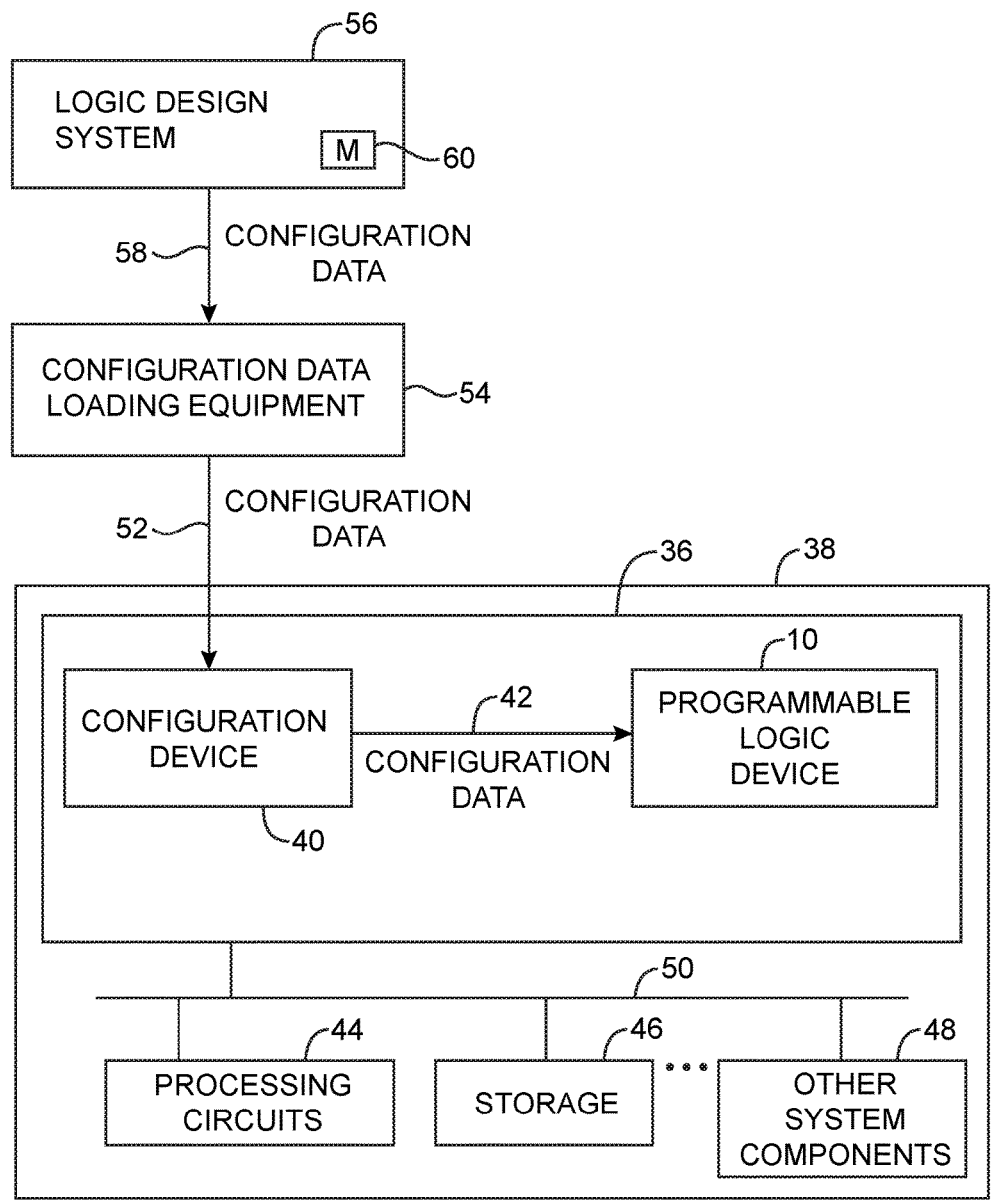
FIG. 2 is a diagram showing how configuration data is created by a logic design system and loaded into a programmable device to configure the device for operation in a system in accordance with an embodiment.

An illustrative system environment for device 10 is shown in FIG. 2. Device 10 may be mounted on a board 36 in a system 38. In general, programmable logic device 10 may receive configuration data from programming equipment or from other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10. Circuit 40 may be an erasable-programmable read-only memory (EPROM) chip, a programmable logic device configuration data loading chip with built-in memory (sometimes referred to as a configuration device), or other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42. System 56 may be based on one or more computers and one or more software programs. In general, software and data may be stored on any computer-readable medium (storage) in system 56 and is shown schematically as storage 60 in FIG. 2.

In a typical scenario, logic design system 56 is used by a logic designer to create a custom circuit design. The system 56 produces corresponding configuration data which is provided to configuration device 40. Upon power-up, configuration device 40 and data loading circuitry on programmable logic device 10 is used to load the configuration data into CRAM cells 20 of device 10. Device 10 may then be used in normal operation of system 38.

As described above, device 10 may include normal CRAM cells that store static configuration data for programming parts of device 10. In accordance with an embodiment, integrated circuit die 10 may also include a dual mode memory element such as dual mode memory cell 300 that can be configured to operate as: (1) a normal CRAM cell and (2) a static random-access memory (SRAM) cell for storing user data. In the first mode, memory cell 300 can be used to supply configuration bits for a lookup table (LUT), to supply control bits for a multiplexing circuit, or to supply configuration bits for other routing and programmable circuitry on device 10 (as examples). The first mode is therefore sometimes referred to as the "LUT mode." In the second mode, memory cell 300 may be used to store user data, which can change throughout normal operation of device 10. Care has to be taken not to inadvertently overwrite any user content stored in memory cells 300 configured in the second mode. The second mode can be referred to as the "RAM mode." Memory cell 300 is therefore sometimes referred to as a LUTRAM cell.

LUTRAM cell 300 may have a configuration write port that can be used to load configuration data into cell 300. The configuration write port may be activated during full device configuration (e.g. an operation in which a full configuration image programs the entire device 10), partial reconfiguration (e.g., an operation in which only part of device 10 is being reconfigured), scrubbing (e.g., an operation in which desired data is being reloaded into device 10), error detection and correction operations such as cyclic redundancy check (CRC) operations, and/or other types of configuration processes. LUTRAM cell 300 may also have a user write port for loading user data into cell 300.

When a given LUTRAM cell 300 is operating in the RAM mode, the configuration write port needs to be gated-off to prevent existing user data in memory cell 300 from being overwritten during partial reconfiguration, scrubbing, error detection and correction, and other configuration operations. As such, gating logic 302 may be inserted at the configuration write port.

LUTRAM cell 300 may have a shared read port that is used both during LUT mode and during RAM mode. In the LUT mode, the read port may be used to read back configuration data in cell 300. In the RAM mode, the read port may be used to read back user data in cell 300. A gating logic may or may not be used at the shared read port to prevent readback of user date during configuration operations.

Programmable integrated circuits 10 include logic circuitry that may be organized into regions of logic blocks sometimes referred to as logic array blocks ("LABs"). Certain types of LABs that include dual-mode LUTRAM cells are designated memory LABs ("MLABs"). In general, the term LAB used herein may be used to refer to any collection of logic circuits and/or memory elements, which may be instantiated as a repeatable unit on device 10.

Figure 4:
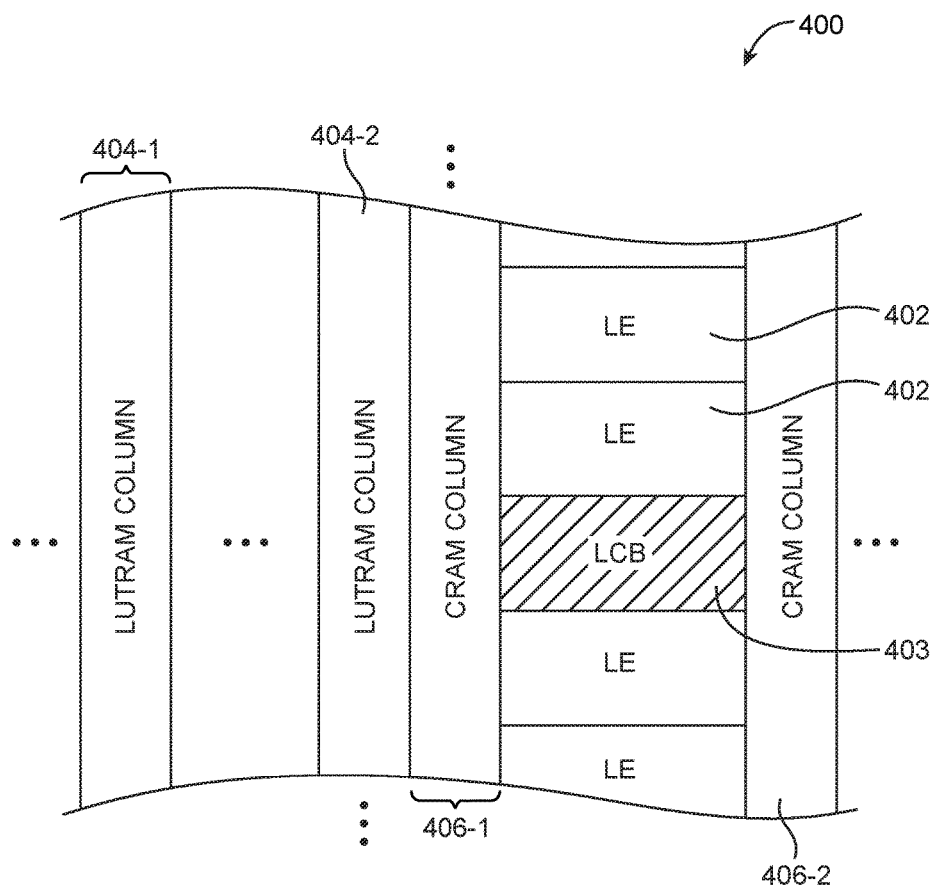
FIG. 4 is a diagram of a memory logic array block that includes two LUTRAM columns and two CRAM columns.

FIG. 4 is a diagram of a memory logic array block 400. As shown in FIG. 4, MLAB 400 includes smaller logic units such as logic elements 402, a logic control block (LCB) 403 for managing the operation of MLAB 400, a first LUTRAM column 404-1, a second LUTRAM column 404-2, a first CRAM column 406-1, and a second CRAM column 406-2. CRAM columns 406-1 and 406-2 include memory cells that are only operable in LUT mode, whereas LUTRAM columns 404-1 and 404-2 include memory cells that are operable in both LUT mode and RAM mode.

In a conventional programmable logic device, each of the two columns 404 includes 400 LUTRAM cells for a total of 800 LUTRAM cells, whereas each of the two columns 406 includes 424 CRAM cells for a total of 848 CRAM cells. In a typical configuration, there is ten logic elements 402, each of which uses a 6-input lookup table. Each 6-input LUT requires 64 LUTRAM cells. As a result, MLAB 400 will need only 640 LUTRAM cells while 160 LUTRAM cells are completely unused. On the other hand, the typical user design may only require 561 bits for configuration (i.e., 561 CRAM cells will be needed while 287 CRAM cells are completely unused). In such scenarios, there are 447 total (160+287) unused memory cells, which is wasteful in terms of die area and leakage devoted to these idle cells. It would therefore be desirable to provide an arrangement with improved memory utilization.

Figure 5:
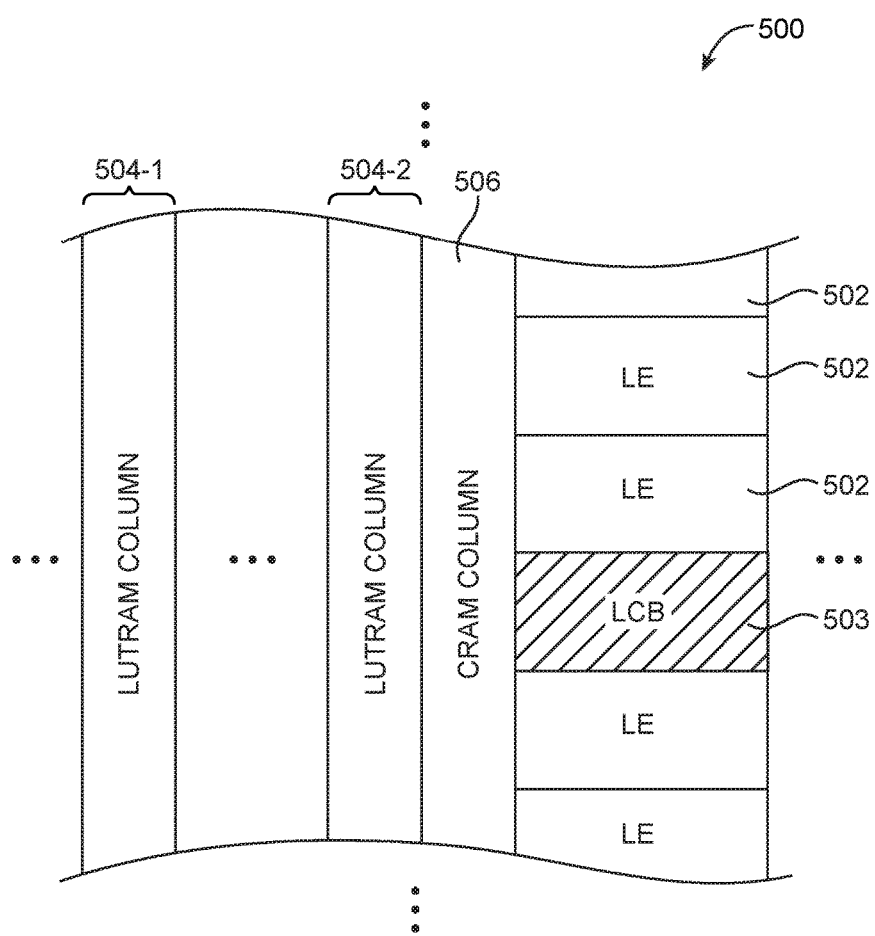
FIG. 5 is a diagram of an illustrative memory logic array block (MLAB) that includes two LUTRAM columns and only one CRAM column in accordance with an embodiment.

FIG. 5 is a diagram of an illustrative logic region such as memory logic array block (MLAB) 500 that can be formed on programmable integrated circuit 10. As shown in FIG. 5, MLAB 500 may include a plurality of logic sub-blocks such as logic elements 502, a logic control block (LCB) 503, at least two LUTRAM columns 504-1 and 504-2, and only one CRAM column 506. Logic control block 503 (shaded) may be responsible for selecting which clock signals are used for each logic element 502, interconnecting logic elements 502 in a chain, and otherwise coordinating the function of MLAB 500 as a whole. LCB 503 may be configured using a small subset of cells in CRAM column 506. As an example, LCB 504 may be configured using 24 CRAM cells in column 506.

Figure 3:
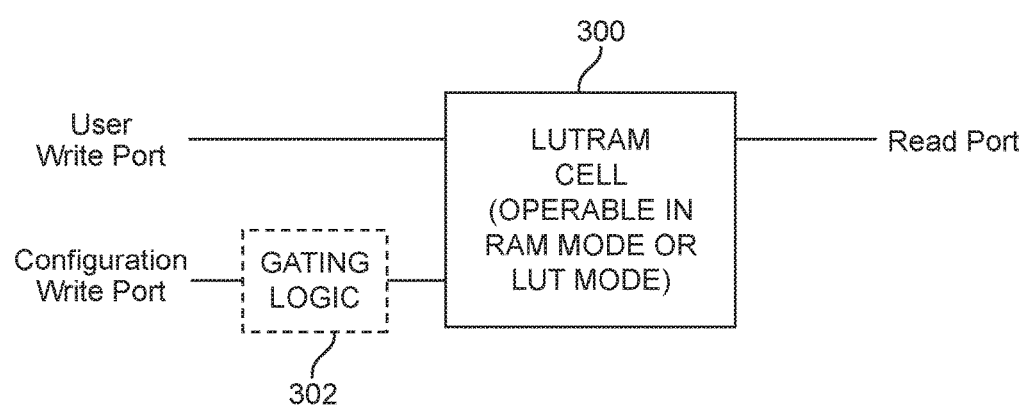
FIG. 3 is a diagram of an illustrative dual mode memory element in accordance with an embodiment.

In contrast to FIG. 3, MLAB 500 includes only one CRAM column 506. Consider an example where the two LUTRAM columns include a total of 800 LUTRAM cells, but only 640 LUTRAM cells are actively used by the logic elements (e.g., 160 LUTRAM cells are otherwise available for other usage). If CRAM column 506 includes less than the number of CRAM cells required for configuration, the difference between the number of CRAM cells in column 506 and the required number of CRAM cells for configuration may be made up using the unused LUTRAM cells in the LUTRAM columns. In other words, a portion of the 160 spare LUTRAM cells may be reused as CRAM cells, thereby obviating the need for a second CRAM column as in the arrangement of FIG. 4 (e.g., a first portion of the LUTRAM column is operable in both LUT mode and RAM mode, whereas a second portion of the LUTRAM column is only operable in RAM mode). Configured in this way, MLAB 500 exhibits at least 5-10% smaller area compared to that of MLAB 400 shown in FIG. 4.

Figure 6:
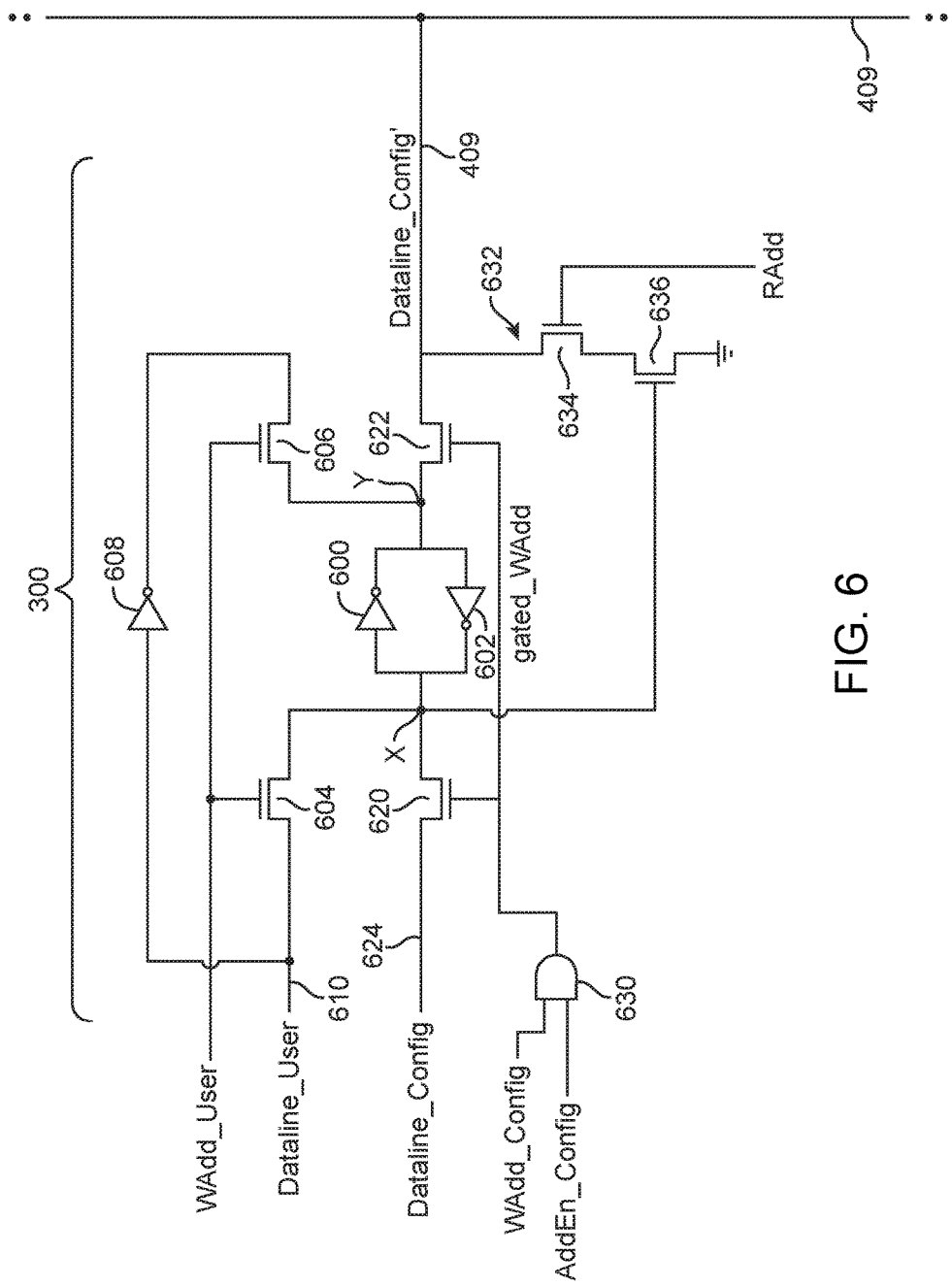
FIG. 6 is a diagram showing one suitable circuit implementation of a dual mode memory cell in accordance with an embodiment.

In order for both LUTRAM cells and CRAM cells to coexist in the same memory column, special handling of read and write operations may be required. In order to fully appreciate the requirements for operating a memory column to support both LUTRAM cells and CRAM cells, it would be helpful to first examine the implementation of a LUTRAM cell. FIG. 6 is a diagram showing one suitable circuit implementation of a LUTRAM cell 300. As shown in FIG. 6, memory cell 400 may include cross-coupled inverters 600 and 602 that form a bistable element. Inverter 600 may have an input that is connected to data storage node X, which is driven by the output of inverter 602. Inverter 602 may have an input that is connected to data storage node Y, which is driven by the output of inverter 600.

A user data line such as data line 610 may be coupled to node X via access transistor 604 and also coupled to node Y via inverter 608 and access transistor 606. Access transistors 604 and 606 may be controlled by user write address signal WAdd_User and may serve collectively as the user write port.

A first configuration data line 624 may be coupled to node X via access transistor 620, whereas a second configuration data line Dataline_Config' may be coupled to node Y via access transistor 622. Access transistors 620 and 622 may be controlled by write address signal gating logic 630. In particular, gating logic 630 may be a logic AND gate having a first input that receives configuration write address signal WAdd_Config, a second input that receives a write enable signal AddEn_Config, and an output at which a corresponding gated write address signal gate_WAdd is provided.

During a configuration write operation, configuration address enable signal AddEn_Config may be asserted (i.e., driven high) when cell 300 is configured to operate in LUT mode or may be deasserted (i.e., driven low) when cell 300 is configured to operate in RAM mode. Access transistors 620 and 622 controlled by gated address signal gated_WAdd may serve collectively as the configuration write port for memory cell 400. Gating logic 630 therefore serves to gate off the configuration write port when cell 300 is placed in the RAM mode.

Data line 409 may also be coupled to a configuration read circuit such as read circuit 632. Read circuit 632 may include pull-down transistors 634 and 636 coupled in series between data line 409 and the ground line. Transistor 636 may have a gate terminal that is connected to node X. Transistor 634 may have a gate terminal that is coupled to read address signal RAdd. Read access transistors 634 and 636 may serve collectively as the configuration and the user read port for memory cell 300 (e.g., the same read port is used for both RAM and LUT modes).

As described above, LUTRAM cells need to have write gating logic 630 to help gate off the configuration write port during RAM mode to prevent any user data from being overwritten during configuration operations. Similarly, the read port also needs to be separately handled depending on the mode of the cell currently being accessed. If the accessed cell is in RAM mode, the read port needs to be masked to prevent reading back user data. This "masking" of the read port may be implemented as a pull-down of data line 409 such that only a low signal will be read back whenever a LUTRAM cell that is in RAM mode is currently being accessed.

The arrangement of LUTRAM cell 300 shown in FIG. 6 is merely illustrative. In contrast, a CRAM cell need not include a separate user write port since it is only operated in LUT mode, thereby obviating the need for access transistors 604 and 606.

Figure 7:
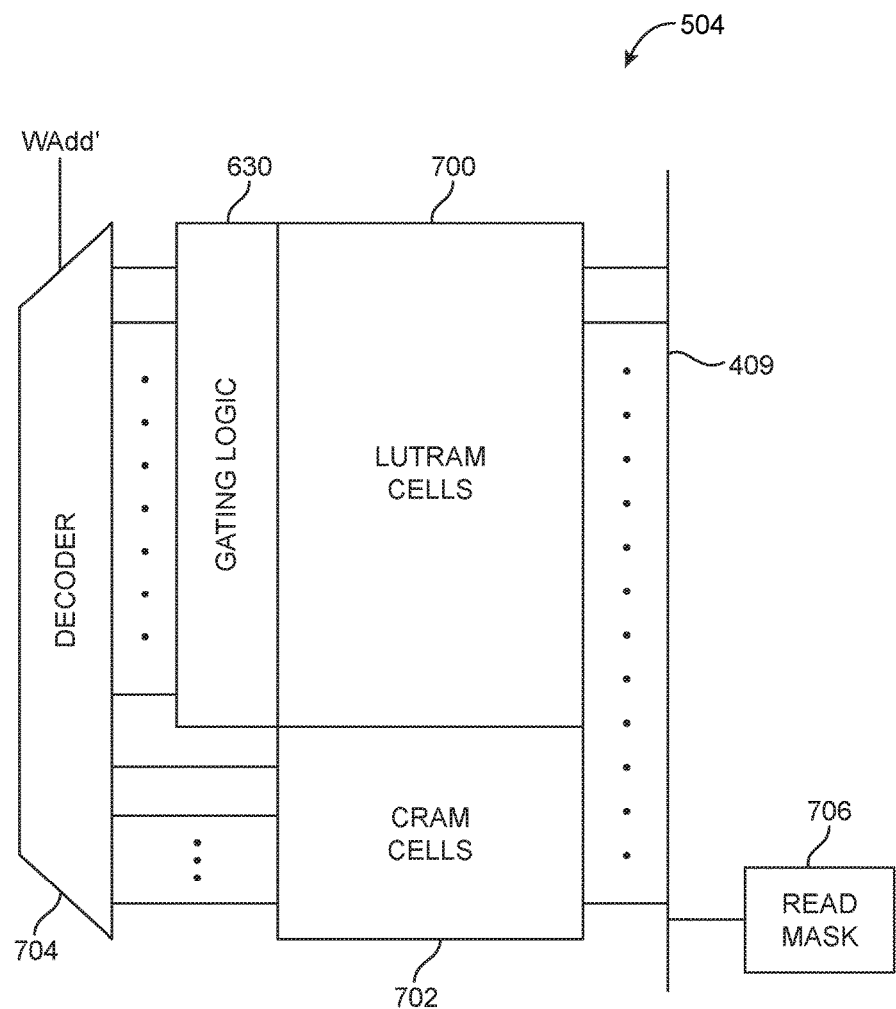
FIG. 7 is a diagram showing how a LUTRAM column may include a portion that is reused for CRAM cells in accordance with an embodiment.

The separate configuration read and write blocking logic is shown in FIG. 7. As shown in FIG. 7, a LUTRAM column 504 may include both LUTRAM cells 700 (e.g., memory cells that are operable in both LUT mode and RAM mode) and CRAM cells 702 (e.g., memory cells that are operable only in LUT mode). Memory cells 700 and 702 may be addressed using a write address decoding circuit such as write address decoder 704. Decoder 704 may receive write address bits WAdd' and output corresponding decoded write address signals to access a selected one of the memory cells in column 504.

In particular, only LUTRAM cells 700 may have write address gating logic 630 to prevent the user content from being overwritten when cells 700 are operated in RAM mode. No gating logic is needed for the configuration write port of CRAM cells 702 (see, e.g., AND gate 630 is not needed in FIG. 6). Column 504 is either configured in RAM mode or LUT mode as a whole. In other words, if column 504 is configured in RAM mode, every single LUTRAM cell 700 in that column is in RAM mode. On the other hand, if column 504 is configured in LUT mode, every single LUTRAM cell 700 in that column is in LUT mode. Regardless, CRAM cells 702 will always be operated in LUT mode, so no gating logic is needed.

Moreover, a read masking circuit such as circuit 706 may be coupled to read data line 409. Read masking circuit 706 may be activated whenever the following two conditions are met: (1) LUTRAM cells 700 are configured in RAM mode and (2) one of those LUTRAM cells 700 is currently being accessed. Activating circuit 706 effectively sets the voltage on data line 409 to a predetermined level such that a configuration readback will not be affected by the user content that is currently being stored in cell 700, which is oftentimes unpredictable. In all other situations (e.g., if LUTRAM cells 700 are configured in LUT mode and/or if one of the CRAM cells 702 is currently being accessed), read masking circuit 706 is disabled so that the actual content in the accessed cell can be read out.

Figure 8:
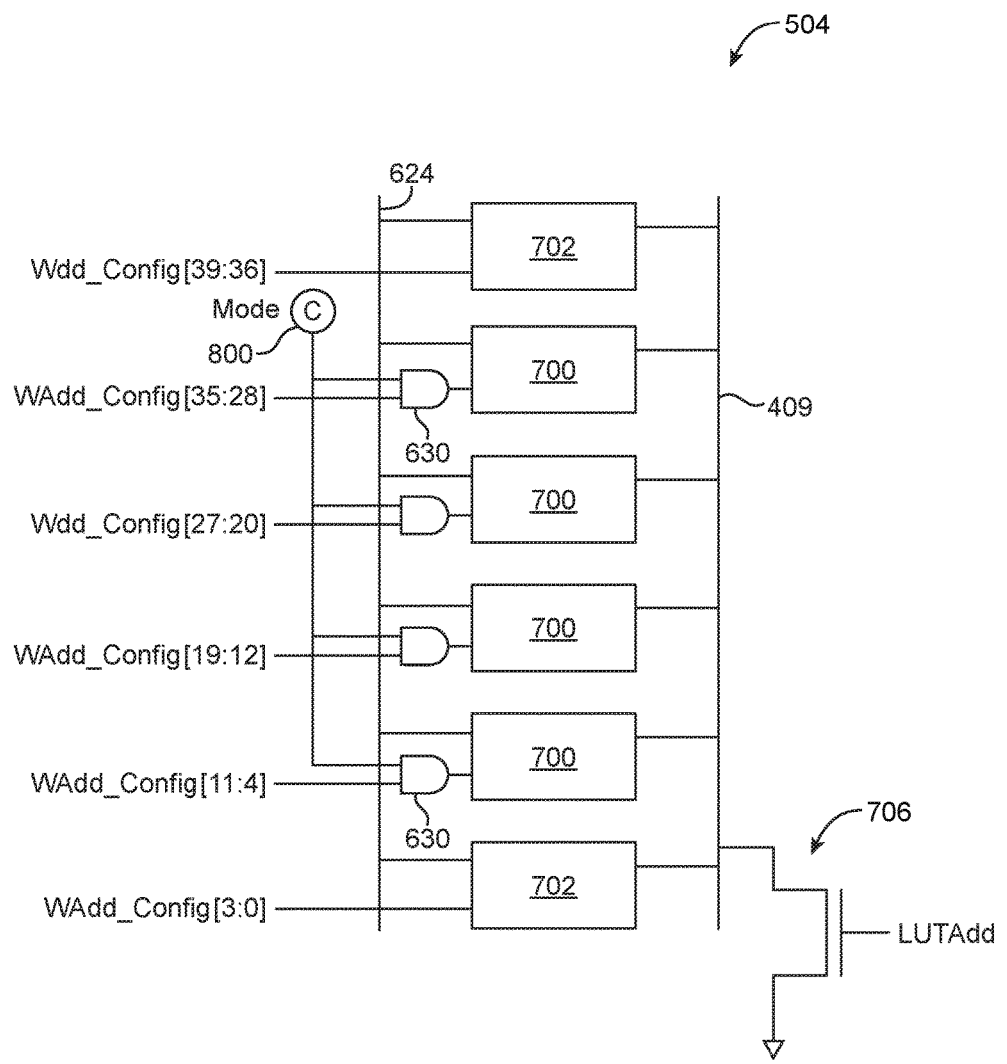
FIG. 8 is a diagram showing how only LUTRAM cells in the LUTRAM column of FIG. 7 may include write address gating logic in accordance with an embodiment.

FIG. 8 is a diagram showing how only LUTRAM cells 700 in the LUTRAM column of FIG. 7 may include write address gating logic. In the example of FIG. 8, there are 40 memory cells in LUTRAM column 504, where decoded address bits WAdd_Config[3:0] and WAdd_Config[39:36] address CRAM cells 702 while address bits WAdd_Config [35:4] address LUTRAM cells 700. Each memory cell in column 504 is coupled to data lines 624 and 409.

In particular, each of the LUTRAM cells 700 may be controlled by associated logic gate 630 that receives the corresponding address signal and also a mode control signal from memory element 800. Memory element 800 may be a volatile or non-volatile memory cell that stores static control signal Mode that determines in which mode the LUTRAM cells 700 in column 504 are configured. If signal Mode is high, LUTRAM cells 700 are operated in LUT mode such that gating logic 630 will allow the configuration write port to overwrite the cell content. If signal Mode is low, LUTRAM cells 700 are operated in RAM mode such that gating logic 630 will block/prevent the configuration write port from overwriting the user content. Signal Mode has no effect on CRAM cells 702 since they do not have any write gating logic.

Still referring to FIG. 8, read masking circuit 706 may be implemented as a pull-down transistor. Pull-down transistor 706 may be an n-channel transistor with a gate terminal that receives control signal LUTAdd. As described above in connection with FIG. 7, signal LUTAdd may only be asserted (e.g., driven high) if one of bits WAdd_Config[35: 4] addressing LUTRAM cells 700 is high and if signal Mode is low. If signal Mode is high or if one of the CRAM cells is being accessed, signal LUTAdd will be deasserted (e.g., driven low) such that transistor 706 is turned off. Once asserted, signal LUTAdd will turn on transistor 706 and drive data line 409 towards ground.

The configuration of FIG. 8 where the top and bottom portions of LUTRAM column 504 are reused as CRAM cells is merely illustrative and is not intended to limit the scope of the present embodiments. In other suitable arrangements, only a top portion of column 504 may be dedicated to CRAM cells, only a bottom portion of column 504 may be devoted to CRAM cells, only a middle portion of column 504 may be reused as CRAM cells, or other suitable portion(s) of column 504 may be assigned to operable only as CRAM cells.

Figure 9:
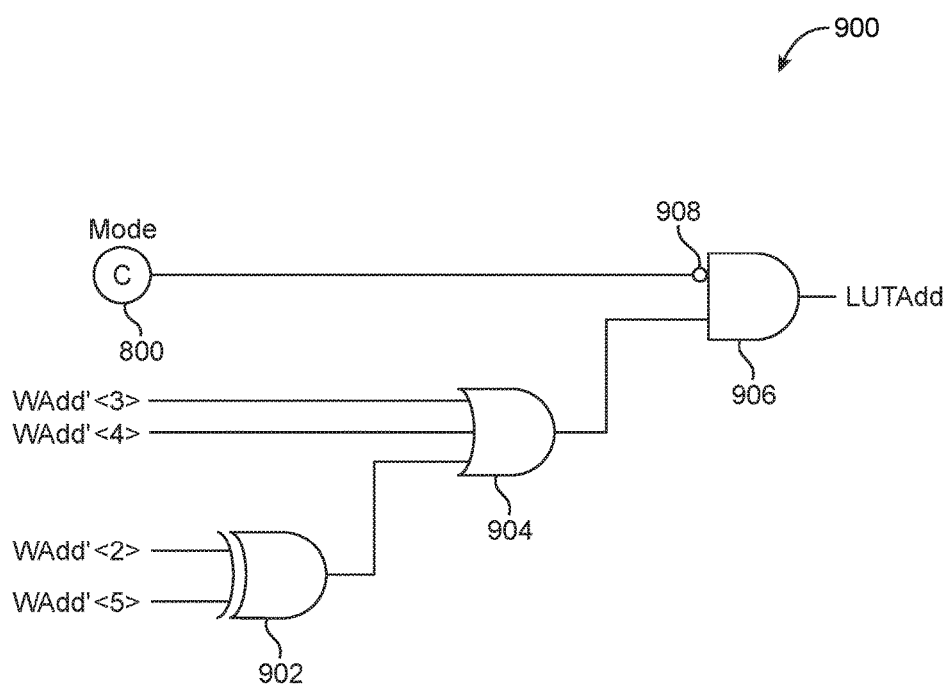
FIG. 9 is a diagram of illustrative address decoding logic for masking a configuration read operation in accordance with an embodiment.

FIG. 9 is a diagram of illustrative address decoding logic for generating control signal LUTAdd that selectively masks a configuration read operation. As shown in FIG. 9, decoding logic 900 may include a first logic gate 902 (e.g., a logic XOR gate), a second logic gate 904 (e.g., a logic OR gate), and a third logic gate 906 (e.g., a logic AND gate). Logic gates 902, 904, and 906 may be coupled in series and may receive only a subset of the pre-decoded write address bits WAdd' and signal Mode from memory element 800.

In particular, XOR gate 902 may have a first input that receives write address bit WAdd'<2>, a second input that receives write address bit WAdd'<5>, and an output. OR gate 904 may have a first input that receives write address bit WAdd'<3>, a second input that receives write address bit WAdd'<4>, a third input that receives signals from the output of gate 902, and an output. AND gate 906 may have a first inverting input (see bubble 908) that receives signal Mode, a second non-inverting input that receives signals from the output of gate 904, and an output on which control signal LUTAdd is generated. Configured in this way, when signal Mode is high (i.e., when the LUTRAM column is in LUT mode), signal LUTAdd is forced to a logic "0". Otherwise, when signal Mode is low (i.e., when the LUTRAM column is in RAM mode), signal LUTAdd will be asserted to a logic "1" only when bit WAdd'<3> or WAdd'<4> is high, or when only one of bits WAdd'<2> and WAdd'<5> is high. This particular implementation of decoding logic 900 as shown in FIG. 9 corresponds to the arrangement of FIG. 8 where the top and bottom memory cells in the LUTRAM column are reused as CRAM cells. Decoding logic 900 may be formed using other suitable logic gates and/or receive other address bits depending on which portion(s) of the LUTRAM column is being dedicated for CRAM usage.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA/INTEL Corporation.

The foregoing is merely illustrative of the principles of this invention and various modifications can be made by those skilled in the art. The foregoing embodiments may be implemented individually or in any combination.

What is claimed is:

1. An integrated circuit, comprising:
a column of memory cells, wherein a first portion of the column of memory cells is operable in a first mode and in a second mode that is different than the first mode, wherein a second portion of the column of memory cells is operable only in the first mode, and wherein the first mode comprises a lookup table (LUT) mode.

2. The integrated circuit of claim 1, wherein the second mode comprises a random-access memory (RAM) mode).

3. The integrated circuit of claim 1, wherein each memory cell in the column has a user write port and a configuration write port.

4. The integrated circuit of claim 3, wherein the first portion of the column of memory cells includes gating logic at each configuration write port.

5. The integrated circuit of claim 4, wherein the second portion of the column of memory cells lacks any gating logic at each configuration write port.

6. The integrated circuit of claim 3, wherein each memory cell in the column has a read port, the integrated circuit further comprising:
a read masking circuit connected to the read port.

7. The integrated circuit of claim 6, wherein the read masking circuit comprises a pull-down transistor.

8. The integrated circuit of claim 6, further comprising:
address decoding logic that controls the read masking circuit.

9. The integrated circuit of claim 8, wherein the address decoding logic activates the read masking circuit only when the first portion is operated in the second mode and if the first portion is currently being accessed.

10. A method of operating an integrated circuit that includes a column of memory cells, the method comprising:
operating a first portion of the column in a first mode, wherein operating the first portion of the column in the first mode comprises operating the first portion of the column in a random-access memory (RAM) mode;
operating the first portion of the column in a second mode that is different than the first mode; and
only operating a second portion of the column in the first mode.

11. The method of claim 10, wherein only operating the second portion of the column in the first mode comprises operating the second portion of the column in only a lookup table (LUT) mode.

12. The method of claim 10, further comprising:
with write address gating logic, selectively gating only configuration write ports of the first portion without gating configuration write ports of the second portion.

13. The method of claim 10, further comprising:
with a read masking circuit, pulling down read ports of the column in response to accessing a selected memory cell in the first portion while operating the first portion in the second mode.

14. An integrated circuit, comprising:
a first memory column that includes dual mode memory cells; and
a second memory column that includes only single mode memory cells, wherein a portion of the first memory column is reused as additional single mode memory cells, and wherein the second memory column is selected.

15. The integrated circuit of claim 14, wherein the dual mode memory cells in the first memory column comprise lookup table random-access memory (LUTRAM) cells that are operable in a lookup table (LUT) mode and a random-access memory (RAM) mode.

16. The integrated circuit of claim 15, wherein the single mode memory cells in the second memory column comprise configuration random-access memory (CRAM) cells that are only operable in the LUT mode.

17. The integrated circuit of claim 14, further comprising:
a third memory column that includes additional dual mode memory cells.

* * * * *